(12) United States Patent
Hu

(10) Patent No.: US 6,445,045 B2
(45) Date of Patent: *Sep. 3, 2002

(54) LOW RESISTIVITY TITANIUM SILICIDE STRUCTURES

(75) Inventor: Yongjun Hu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/906,464

(22) Filed: Jul. 16, 2001

Related U.S. Application Data

(63) Continuation of application No. 08/802,884, filed on Feb. 19, 1997, now Pat. No. 6,262,458.

(51) Int. Cl.$^7$ .............................................. H01L 29/76
(52) U.S. Cl. ..................... 257/384; 257/388; 257/412; 257/413; 257/754; 257/755
(58) Field of Search ................................ 257/412, 413, 257/388, 764, 754, 755

(56) References Cited

U.S. PATENT DOCUMENTS

| | | | |
|---|---|---|---|
| 4,784,973 A | 11/1988 | Stevens et al. | 437/200 |
| 4,788,160 A | 11/1988 | Havemann et al. | 437/200 |
| 4,897,368 A | 1/1990 | Kobushi et al. | 437/200 |
| 4,912,542 A | 3/1990 | Suguro | 357/67 |
| 4,923,822 A | 5/1990 | Wang et al. | 437/41 |
| 4,935,804 A * | 6/1990 | Ito et al. | 357/71 |
| 5,210,043 A | 5/1993 | Hosaka | 437/30 |
| 5,381,302 A | 1/1995 | Sandhu et al. | 361/305 |
| 5,395,787 A | 3/1995 | Lee et al. | 437/57 |
| 5,397,744 A | 3/1995 | Sumi et al. | 437/200 |
| 5,534,713 A | 7/1996 | Ismail et al. | 257/24 |
| 5,541,131 A | 7/1996 | Yoo et al. | 437/44 |
| 5,545,574 A | 8/1996 | Chen et al. | 437/40 |
| 5,545,581 A | 8/1996 | Armacost et al. | 437/52 |
| 5,569,947 A | 10/1996 | Iwasa et al. | 257/336 |
| 5,624,869 A | 4/1997 | Agnello et al. | 438/602 |
| 5,633,200 A | 5/1997 | Hu | 438/653 |
| 5,650,648 A | 7/1997 | Kapoor et al. | 257/316 |
| 5,656,546 A | 8/1997 | Chen et al. | 438/586 |
| 5,665,646 A | 9/1997 | Kitano | 438/592 |
| 5,668,394 A | 9/1997 | Lur et al. | 257/413 |
| 5,682,055 A | 10/1997 | Huang et al. | 257/408 |
| 5,710,438 A | 1/1998 | Oda et al. | 257/69 |
| 5,723,893 A | 3/1998 | Yu et al. | 257/413 |
| 5,726,479 A | 3/1998 | Matsumoto et al. | 257/412 |
| 5,728,625 A | 3/1998 | Tung | 438/586 |
| 5,739,064 A | 4/1998 | Hu et al. | 438/528 |
| 5,796,151 A | 8/1998 | Hsu et al. | 257/410 |
| 5,856,698 A | 1/1999 | Hu et al. | 257/412 |
| 5,874,351 A | 2/1999 | Hu et al. | 438/527 |
| 5,874,353 A | 2/1999 | Lin et al. | 438/592 |
| 5,945,719 A | 8/1999 | Tsuda | 257/413 |

FOREIGN PATENT DOCUMENTS

| | | | |
|---|---|---|---|
| EP | 0746015 | 12/1996 | H01L/21/3065 |

OTHER PUBLICATIONS

Beyers, R., et al., "Titanium disilicide formation on heavily doped silicon substrates", *Journal of Applied Physics*, vol. 61, No. 11, 5110–5117, (Jun. 1, 1987).

Hosoya, T., et al., "A Polycide Gate Electrode with a Conductive Diffusion Barrier Formed with ECR Nitrogen Plasma for Dual Gate CMOS", *IEEE Transactions on Elelctron Devices*, 42, No. 12, pp. 2111–2116, (Dec. 1995).

(List continued on next page.)

Primary Examiner—Cathy Lam
(74) Attorney, Agent, or Firm—Schwegman, Lundberg, Woessner & Kluth, P.A.

(57) ABSTRACT

Methods and apparatus for forming a conductor layer utilize an implanted matrix to form C54-titanium silicide. Word line stacks formed by the methods of the invention are used in sub-0.2 micron line width applications, interconnects, and silicided source/drain regions, among other applications, and have a lower resistivity and improved thermal stability.

32 Claims, 4 Drawing Sheets

OTHER PUBLICATIONS

Ito, T., et al., "A Nitride–Isolated Molybdenum–Polysilicon Gate Electrode for MOS VLSI Circuits", *IEEE Transactions on Electron Devices*, vol. ED–33, No. 4, 464–468, (Apr. 1986).

Kobushi, K., et al., "A High Integrity and Low Resistance Ti–Polycide Gate Using a Nitrogen Ion–Implanted Buffer Layer", *Japanese Journal of Applied Physics/Part 2: Letters*, 27, No. 11, pp. L2158–L2160, (Nov. 1988).

Pan, P., et al., "Highly Conductive Electrodes for CMOS", *Proc. of the international symposium on USLI Sci & Tech*, ECS, Inc., Pennington, NJ, 104–109, (1989) No Month.

Shimizu, S., et al., "0.15um CMOS Process for High Performance and High Reliability", *IEEE*, pp. 4.1.1–4.1.4, (1994) No Month.

* cited by examiner

LOW RESISTIVITY TITANIUM SILICIDE STRUCTURES

This application is a Continuation of U.S. Ser. No. 08/802,884 filed Feb. 19, 1997, now U.S. Pat. No. 6,262,458.

FIELD OF THE INVENTION

The present invention relates to the manufacture of semiconductor devices, and in particular, to the manufacture of conductor layers utilized in advanced semiconductor products, such as memories.

BACKGROUND

Semiconductor memory devices are comprised of an array of memory cells. Each memory cell is comprised of a capacitor, on which the charge stored represents the logical state of the memory cell. A charged capacitor corresponds to a logical state of "1" and an uncharged capacitor corresponds to a logical state of "0." Word lines activate access transistors, so that the logical state of a memory cell can be read. Gates of multiple transistors are formed as one word line.

An example of a word line's application is in a dynamic random access memory (DRAM). In a DRAM, a common word line, used to access memory cells, is fabricated on a p-type silicon substrate coated with a thin film of silicon dioxide ($SiO_2$), known as gate oxide. Then, a word line is formed on the gate oxide layer as a two-layer stack, comprising silicon (or polysilicon), coated with a conductor material. The most common two-layer stack used in the industry is a layer of polysilicon, coated with a tungsten silicide layer. Tungsten silicide is used because of its good integration properties, such as providing good thermal stability, stability during source/drain oxidation, and stability during dry etching, as well as having a low resistivity. Although titanium silicide is approximately 75% less resistive than tungsten silicide, it has not been used extensively in two-layer stacks because it is not as thermally stable. Titanium silicide tends to agglomerate during subsequent high temperature processing steps. Alternatively, a metal is used instead of a silicide for the conductor layer.

Forming high conductivity films on word lines is one attempt to decrease the resistivity of a word line. Such films are commonly formed of a refractory metal silicide, such as titanium silicide ($TiSi_2$). Titanium is preferably used as the refractory metal component because it has the ability to reduce oxygen, which remains on surfaces in the form of native oxides. Native oxides are reduced to titanium oxide by titanium. Native oxides degrade interface stability, and often cause device failure if not removed.

However, several problems occur with the use of $TiSi_2$ in ULSI applications. At higher temperatures subsequent processing temperatures, $TiSi_2$ has a tendency to agglomerate into two different phases, C54 and C49, which have different lattice structures. The C54 phase agglomerates at the interfaces between C49—$TiSi_2$ and silicon (or polysilicon). While this is undesirable due to the increased resistance associated with agglomeration, the $TiSi_2$ phase formed at higher temperatures, C54, is more stable and has a much lower resistivity than the C49 metastable phase formed at lower temperatures.

Another problem with using $TiSi_2$ at higher temperatures is that the high-temperature phase, C54, has a grain size typically ranging from 0.3 to over 1.0 microns, which prohibits it from being used in sub-0.25 micron word line applications. However, it is always desirable to form a phase having the lowest free energy at a particular grain size, so that it is the most stable. FIG. 1 illustrates how free energy, $\Delta G_f(\gamma)$, is a function of grain size, r. Free energy, $\Delta G_f(\gamma)$, as a function of grain size, r, is divided into three regions: A, B, and C. The most stable phase at a given grain size is that which has the lowest free energy. Both regions A and B are in the sub-micron range. In the sub-micron range, the free energy of C54 is greater than that of C49, due to the larger surface energy of C54.

In ultra large scale integrated (ULSI) circuits, a highly conductive word line is necessary to improve circuit density and performance. To date, word line resistance is one of the primary limitations of achieving faster ULSI circuits. A method for decreasing the resistivity of word lines is needed for use in ULSI applications. In order to use the C54—$TiSi_2$ phase in ULSI circuits, particularly in 256 Megabit DRAMs and other devices requiring sub-0.25 micron line widths, it is necessary that the grain size be reduced, so that it will be more stable. Due to the increased sensitivity of ULSI circuits, it is important to maintain low resistivity in ULSI devices. There is a need for a stable, low resistivity $TiSi_2$ phase which can be used in sub-0.25 micron word line applications.

SUMMARY OF THE INVENTION

A method for forming a word line, which is used in ultra-large scale integrated (ULSI) circuits, produces a lower resistivity word line than those formed using prior art techniques. Resistivity is lowered and grain size of the conductor layer is modified using barrier elements to form a low dose matrix in silicon, or polysilicon. Subsequently annealing the word line stack forms a preferential C54-titanium silicide ($TiSi_2$). C54—$TiSi_2$ is more stable at high temperatures than C49—$TiSi_2$. Use of C54—$TiSi_2$ minimizes problems with C49—$TiSi_2$ agglomerating at higher temperatures. Furthermore, C54—$TiSi_2$ has a much lower resistivity than C49—$TiSi_2$. Sub-0.25 micron word lines are able to be silicided with C54—$TiSi_2$ using the invention, due to modification of $TiSi_2$ grain sizes using the implanted matrix. Previously, the relatively large size of C54—$TiSi_2$ grains, greater than 0.3 microns, prohibited its use in sub-0.25 micron word line applications.

DETAILED DESCRIPTION

Figure 1:
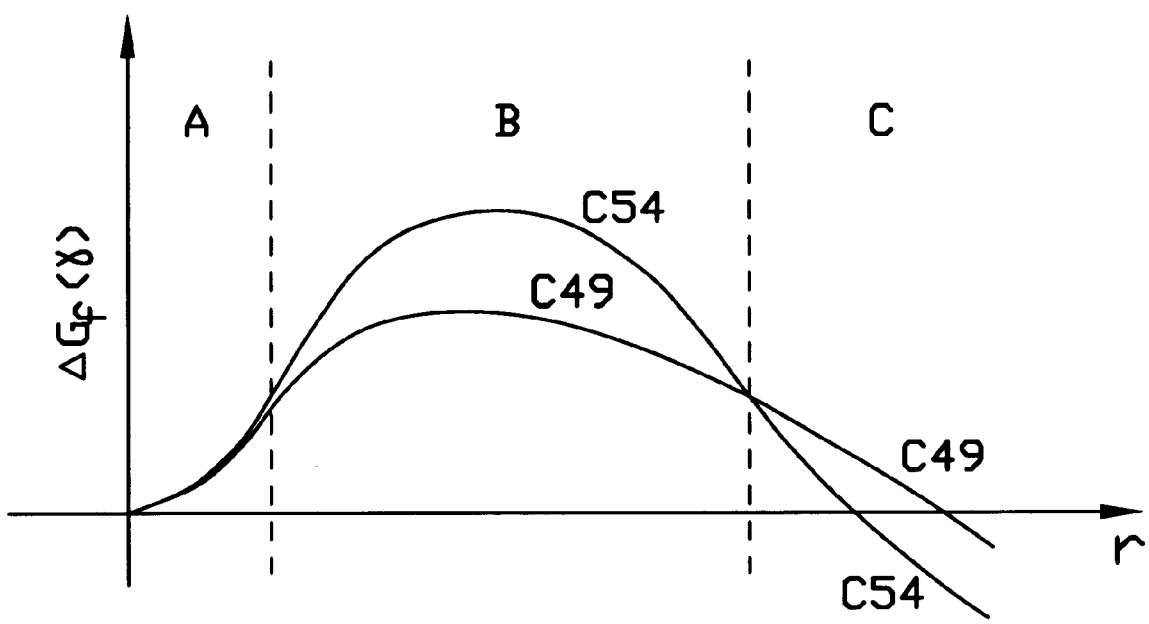
FIG. 1 is a graph illustrating free energy of C54—$TiSi_2$ and C49—$TiSi_2$ as a function of grain size.

The following description describes a method for forming a word line which is used in ultra-large scale integrated (ULSI) circuits. While the invention is described with reference to it being a word line, other conductors may also be formed by this method for various purposes, especially where reduced resistance is needed. For example, interconnects can be silicided according to the method of the invention in further embodiments of the invention.

Modification of Conductor Layer Resistivity During Word Line Silicidation

Resistivity and grain size of the conductor layer, $TiSi_2$, is modified using barrier elements to form a low dose matrix in silicon, or polysilicon, which modifies the C49—TiSi$_2$ phase to C54—TiSi$_2$, increasing chemical and thermal stability. When using the method to form a word line stack, a p-type silicon substrate is coated with a thin film of silicon oxide (SiO$_2$), known as gate oxide. Then, a word line is formed on the gate oxide layer as a two-layer stack, comprising silicon (or polysilicon), coated with a conductor material. The most common two-layer stack used in the industry utilizes a bottom layer of polysilicon. When using the method of the invention to form a conductor layer in a word line stack, the method is performed subsequent to formation of the bottom silicon layer, and diffusion barrier layers, if any.

This invention is particularly advantageous in the formation of sub-0.25 micron word lines. The advantages to using this invention are that the conductor layer resistivity is lowered; C54 grain size is modified so that it is finer than the word line width, allowing it to be used in sub-0.25 micron applications; the agglomeration temperature of TiSi$_2$ is increased; and, conventional two-step TiSi$_2$ annealing is potentially condensed into a single step. This invention is crucial in the fabrication of 256 Megabit DRAMs and other devices that require line widths of less than 0.25 microns. As line widths decrease in the low sub-micron range, sheet resistance of titanium silicided polysilicon, or silicon, increases significantly. The agglomeration temperature also decreases with decreasing line width. Agglomeration is unwanted because it causes break-up spots, which lead to device failure.

As is well known in the art, TiSi$_2$ forms various phases. One common phase is the base-centered orthorhombic structure, C49—TiSi$_2$. C49 does not require a two-step annealing process for its formation. Deposited titanium is annealed once, between approximately 650 to 750 degrees Celsius, to form the C49 phase. However, use of the C49 phase has many drawbacks. One drawback of the C49 phase is that it has a much higher resistivity (a factor of approximately three) than the face-centered orthorhombic C54 phase. Furthermore, it is a metastable phase, compared to the thermally-stable C54 phase. C49 is also an undesirable TiSi$_2$ phase because it has poor self-passivating properties against tetraethyloxysilicate (TEOS) spacer formation and borophosphosilicate glass (BPSG) reflow during subsequent process steps. Furthermore, agglomeration usually occurs at the C49—TiSi$_2$/polysilicon (or Si) interface due to decomposition of C49 at higher temperatures. If the layer is comprised of the C54 phase, then agglomeration will not occur at higher temperatures.

In comparison, the C54—TiSi$_2$ is a high-temperature bulk phase with low resistivity. It is widely used in metal oxide semiconductor (MOS) device applications, such as silicidation of gates and source/drain regions. The silicide, C54—TiSi$_2$, is usually formed using a two-step annealing process after deposition of titanium on the region to be silicided. Such a region can comprise either polysilicon or silicon, doped or undoped. Traditionally, to form the C54 phase, a two-step annealing process is required. The first annealing step is at a low temperature (between approximately 650 to 750 degrees Celsius), in a nitrogen, or argon, ambient. This step forms the high resistivity, metastable phase C49—TiSi$_2$. Next, unreacted titanium (Ti) and titanium nitride (TiN) are removed with a wet etch. The second annealing step comprises a high temperature (between approximately 750 to 850 degrees Celsius) anneal in a nitrogen (N$_2$), or argon (Ar), ambient. This step transforms the C49—TiSi$_2$ phase to C54—TiSi$_2$. Due to the undesirable properties of C49—TiSi$_2$, complete phase transformation is crucial. It is also crucial to maintain uniformity of phase, as small, nonstoichiometric areas form between boundaries of C49 and C54 phases. Such nonstoichiometric areas are susceptible to oxide growth during subsequent formation of TEOS spacers, resulting in undesirable high resistivity at such boundary areas.

Thus, this invention forms C54 at sub-micron grain sizes in order to decrease the resistivity of the word line stack due to C54's lower resistivity than C49. As illustrated by FIG. 1, in order to form C54 as a stable phase at sub-micron grain sizes, the total energy of the C54 phase needs to be reduced. One method for decreasing the total energy of the C54 phase is to create an implanted matrix in the polysilicon or silicon layer before deposition of titanium. Various barrier elements form a matrix, which provide nucleation sites and grain boundary stabilizers. The roles of different matrix elements are determined by implanting at low dose levels, in a systematic approach.

For each line width, a process window of implant doses is determined, according to different roles of matrix elements. Such a process window comprises a dose and depth for each line width. Group VIA metals, such as Mo and W, form titanium alloys (e.g., TiW and TiMo) with very low heat of formation. Such alloys are good transition materials between titanium and silicon due to their similar covalent radii. They are able to be formed epitaxially on titanium and silicon surfaces, resulting in a low interface energy due to less broken bonds and lower interfacial stress. Therefore, Group VIA elements are good candidates for their roles in creating nucleation sites and their ability to stabilize grain boundaries.

The depth of a matrix depends on the initial titanium layer thickness and the required TiSi$_2$ thickness. Typically, the TiSi$_2$ thickness is below 1,000 angstroms in sub-micron applications. Therefore, a low ion energy implant is utilized.

The dose of a matrix depends on the grain size desired. It is determined using a simple cubic estimation. For example, 0.05 micron grains need $4 \times 10^{12}$ nucleation sites/cm$^2$ for a 500 angstrom thick matrix. Ion implant elements are uniformly distributed in a substrate with a precise depth. The effectiveness of a given element, therefore, can be determined by implanting a known dose of ions and measuring the resulting C54 grain size. Thus, the invention is not limited to implantation of Group VIA elements, when forming the matrix. Any element can be tested according to the above method to determine whether it is suitable for use as a matrix implant element. A process window is determined by varying the ion dose. A wide range of ion doses should be examined in determining a process window, including low doses of $10^{11}$ to $10^{13}$ ions/cm$^2$. The best candidate for a matrix implant element should have a coalescence threshold (or range) with the highest dose, resulting in the finest grain size.

Certain Group VB nonmetal elements, such as: N, P, As, and Sb, can react with titanium to form barrier materials (e.g., TiN, TiP, TiAs, and TiSb). While such elements increase the agglomeration temperature, too many Ti—VB ions at C49—TiSi$_2$/Si (or polysilicon) interfaces hinders transformation of C49 to C54. Group VB elements also have large mismatch covalent radii compared to titanium, particularly As and Sb. This tends to drive the barrier material to the top surface of the TiSi$_2$ film at high temperatures, resulting in agglomeration. High solubility of Group VB in TiSi$_2$ may also affect Group VB element's effectiveness as nucleation sites or boundary stabilizers. However, tests for determining the best matrix implant element can be performed to determine if combining elements of both Group VIA and Group VB is a good choice for a matrix implant element.

Figure 2A:
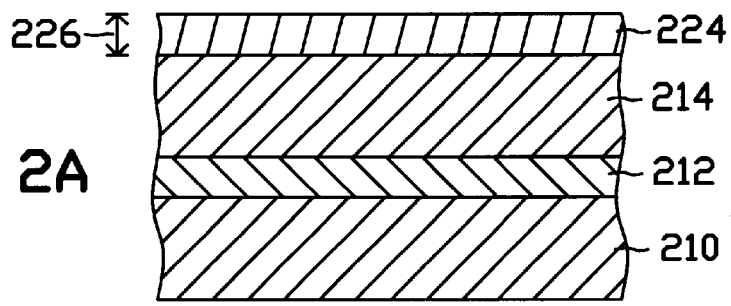
FIGS. 2A to 2F are cross-sectional representations of a method for forming a word line stack in accordance with the invention, using a preformed matrix to modify grain size during silicidation.

As shown in FIG. 2A, a polysilicon or silicon film, doped or undoped, 214 is formed over a semiconductor substrate 210 and gate oxide 212. Next, one Group VIA element, such as W or Mo, is implanted at a low implant energy into the polysilicon or silicon layer 214 to a depth 226 according to the determined process window and to a low dose of approximately $5 \times 10^{11}$ to $1 \times 10^{14}$ ions/cm$^2$, to form an implanted matrix 224.

Figure 2B:
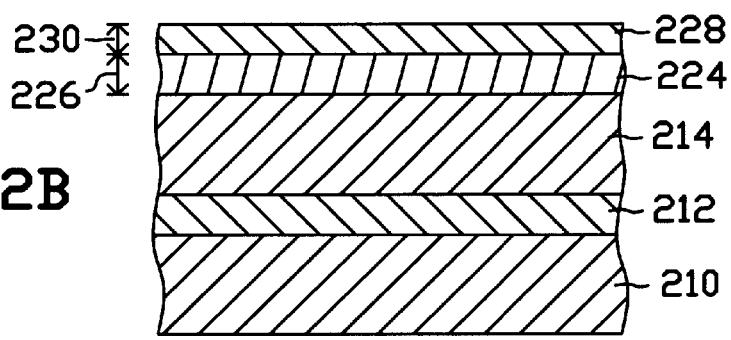
Figure 2C:
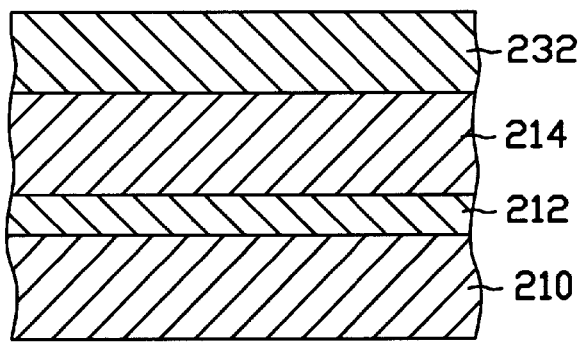

Polycide lines are then formed by depositing titanium 228, as shown in FIG. 2B, on the implanted region, to a depth 230 determined by the desired thickness of TiSi$_2$ and the depth 226 of the matrix 224. A subsequent anneal forms C54—TiSi$_2$ 232, as shown in FIG. 2C. C54—TiSi$_2$ 232 has a finer grain size than the word line width, on which it is formed. If the process is well-controlled, C49 completely transforms into C54, and there is no need for a second annealing step.

The results of this invention were confirmed using several standard test methods, well known to one skilled in the art. The results obtained from these tests are illustrative of the benefits of the invention, but exact results may vary upon duplication, depending on the equipment and parameters used by one performing the tests. Optical microscope measurements of a TiSi$_2$ conductor layer 232, as shown in FIGS. 2C to 2F, formed in accordance with the present invention illustrated that a preformed matrix 224 decreases the surface roughness of the resulting TiSi$_2$ 232, resulting from a finer grain size. Measurements were taken, using a 350 angstrom TiSi$_2$ 232 surface for titanium 228 deposited on a preformed polysilicon matrix 224, comprised of Mo at an approximate dose of $1 \times 10^{14}$ ions/cm$^2$ and for a 350 angstrom TiSi$_2$ surface for titanium 228 deposited on non-implanted (zero matrix) polysilicon 214. Identical results were obtained using a 500 angstrom TiSi$_2$ 232 surface for titanium 228 deposited on a polysilicon matrix 224, comprised of Mo at an approximate dose of $1 \times 10^{14}$ ions/cm$^2$ and a 500 angstrom TiSi$_2$ surface for titanium 228 deposited on non-implanted (zero matrix) polysilicon 214. Identical results were obtained for implanted tungsten (W) preformed matrices 224.

Results of thermal wave, reflectivity, and JEOL transmission electron microscopy (TEM) measurements are consistent with the data described above. UV 1050 reflectivity measurements show a gradual improvement in reflectivity with increasing dose concentration for preformed W and Mo matrix wafers. Decreasing reflectivity corresponds to decreasing grain sizes, due to a smoother surface. Reflectivity is improved even more dramatically between TiSi$_2$ 232, as shown in FIGS. 2C to 2F, thicknesses of 300 to 500 nanometers. Parallel results from thermal wave, JEOL, and optical microscope measurements confirm the reflectivity results.

Furthermore, atomic force microscopy (AFM) studies illustrate how TiSi$_2$ 232 grain size and surface morphology change with matrix 224 concentration changes. A 500 angstrom TiSi$_2$ layer 232 was formed on both a zero matrix and a $1 \times 10^{14}$ Mo ions/cm$^2$ preformed matrix 224. High resolution AFM reveals that small TiSi$_2$ grains tend to coalesce to form large grains in the case of normal silicidation with a zero matrix. This coalescence results in drastic variation of TiSi$_2$ film thickness, as well as surface roughness. Grain sizes of 0.4 microns or larger, resulting from forming TiSi$_2$ on a zero matrix, were measured using AFM. These large grain sizes are undesirable in sub-0.25 micron word line widths. The results of these measurements are very close to those reported by other non-AFM C54 grain size studies. However, a preformed matrix 224 tends to decrease surface roughness by uniformly nucleating and stabilizing individual TiSi$_2$ 232 grains. Coalescence is drastically reduced for a $1 \times 10^{14}$ Mo ions/cm$^2$ preformed matrix 224, resulting in finer grain sizes. This results in more uniform grain size distribution and a much smoother surface.

Figure 2D:
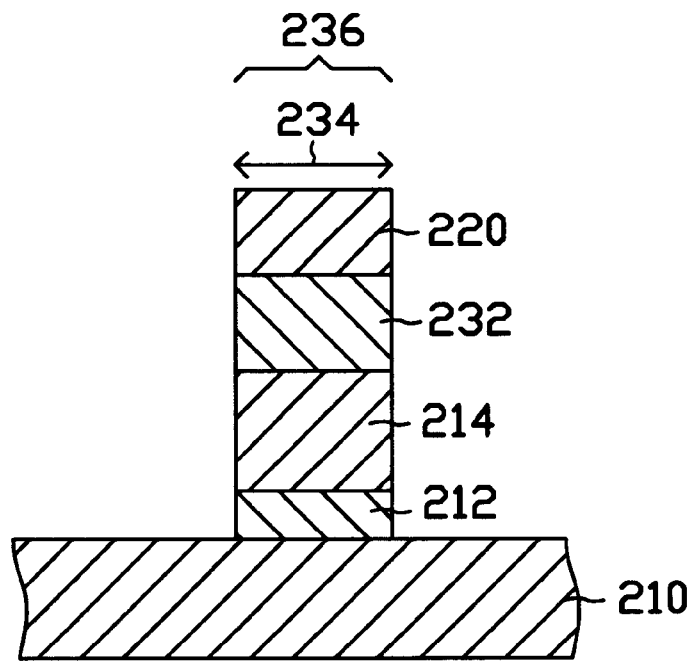
Figure 2E:
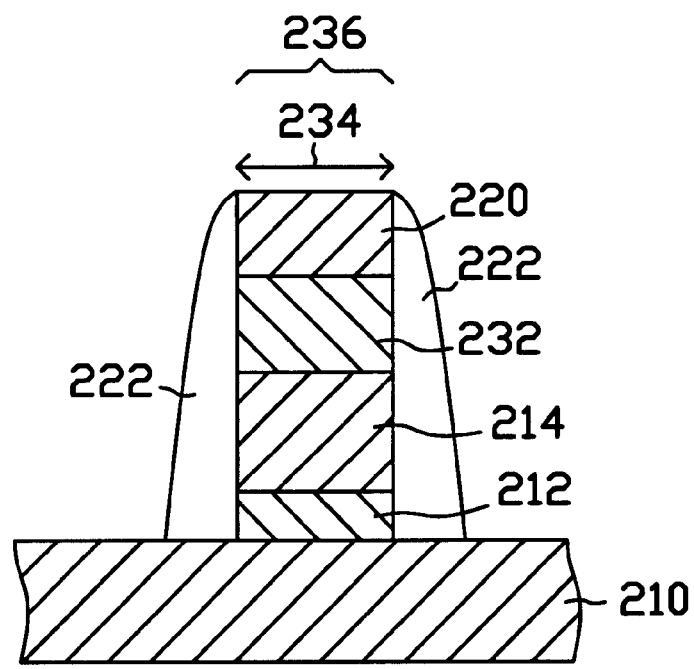
Figure 2F:
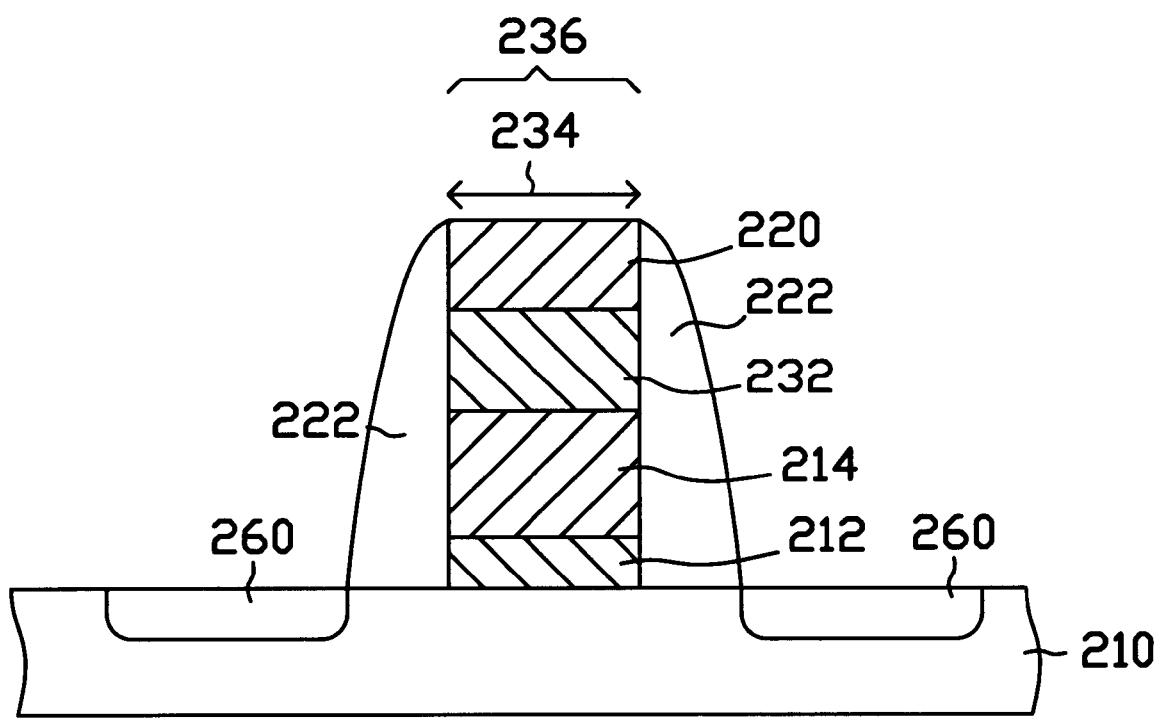

Finally, a cap 220 of one or more dielectric materials, such as silicon oxide or silicon nitride, is applied to the word line stack 236 layers, if needed, according to conventional techniques and shown in FIG. 2D, and the line width 234 is defined by a dry etch, which defines at least one word line stack 236. The width 234 of a word line stack 236 is equal to the line width 234. TiSi$_2$ conductor layers 232 formed in accordance with this embodiment of the invention, are comprised of the preferred C54—TiSi$_2$ phase, with a grain size finer than that of the line width 234. It is preferable to have C54—TiSi$_2$ for the conductor layer 232 due to its lower resistivity than C49—TiSi$_2$. After wafer cleaning, a spacer 222 is formed, as shown in FIG. 2E, and conventional source/drain (S/D) implantation forms doped S/D regions 260 aligned with the spacers 238, as shown in FIG. 2F.

While the method of the invention has been described with reference to forming a conductor layer in a word lines stack, this method is applicable to forming a titanium silicide layer on any semiconductor substrate or device. For example, silicided interconnects are formed using the method of the invention in a further embodiment of the invention. Furthermore, source/drain regions are silicided in even further embodiments of the invention. More variations will be apparent to one skilled in the art.

I claim:

1. A semiconductor structure for providing a low resistivity conductive layer, the semiconductor structure comprising:
   a substrate;
   a gate oxide layer, the gate oxide layer coupled to the substrate;
   a titanium silicide layer, the titanium silicide layer having a C54 TiSi$_2$ lattice structure, the titanium silicide layer including a low resistivity titanium silicide with a reduced grain size, wherein the reduced grain size is less than about 0.25 microns; and
   a semiconductor layer, the semiconductor layer being between the gate oxide layer and the titanium silicide layer, wherein the titanium silicide layer is coupled to the semiconductor layer by a single matrix of nucleation sites.

2. The semiconductor structure of claim 1, wherein the semiconductor structure comprises a sub-0.25 micron word line stack.

3. The semiconductor structure of claim 1, wherein the semiconductor layer is selected from a group consisting of doped silicon, doped polysilicon, undoped silicon, and undoped polysilicon.

4. The semiconductor structure of claim 1, wherein the semiconductor structure has a line width, and wherein the grain size of the low resistivity titanium silicide is less than the line width of the semiconductor structure.

5. The semiconductor structure of claim 1, wherein the single matrix of nucleation sites includes at least one element from a periodic chart grouping that includes molybdenum and tungsten.

6. The semiconductor structure of claim 1, further comprising a dielectric cap coupled to the titanium silicide layer.

7. A semiconductor structure for providing a low resistivity conductive layer, the semiconductive structure comprising:
   a source/drain region, the source/drain region supported by a substrate; and
   a titanium silicide layer, the titanium silicide layer having a C54 TiSi$_2$ lattice structure, the titanium silicide layer coupled to the source/drain region by a single matrix of nucleation sites, the titanium silicide layer including a low resistivity titanium silicide with a reduced grain size, wherein the reduced grain size is less than about 0.25 microns.

8. The semiconductor structure of claim 7, wherein the single matrix of nucleation sites includes at least one element from a periodic chart grouping that includes molybdenum and tungsten.

9. The semiconductor structure of claim 7, wherein the single matrix of nucleation sites includes at least one element from a periodic chart grouping that includes molybdenum and tungsten, and at least one element from a periodic chart grouping that includes arsenic and antimony.

10. A semiconductor structure for providing a low resistivity conductive layer, the semiconductive structure comprising:
    a substrate;
    a gate oxide layer, the gate oxide layer coupled to the substrate;
    a silicon based material layer, the silicon based material layer coupled to the gate oxide layer; and
    a titanium silicide layer, the titanium silicide layer including a low resistivity titanium silicide with a reduced grain size, the titanium silicide layer coupled to the silicon based material layer by a single matrix of nucleation sites,
    wherein the reduced grain size of the low resistivity titanium silicide is less than about 0.25 microns.

11. The semiconductor structure of claim 10, wherein the single matrix of nucleation sites includes at least one element from a periodic chart grouping that includes molybdenum and tungsten.

12. The semiconductor structure of claim 10, wherein the semiconductor structure comprises a sub-0.25 micron two-layer word line stack.

13. The semiconductor structure of claim 10, further comprising a dielectric cap coupled to the titanium silicide layer.

14. The semiconductor structure of claim 10, wherein the silicon based material layer is selected from a group consisting of doped silicon, doped polysilicon, undoped silicon, and undoped polysilicon.

15. The semiconductor structure of claim 10, wherein the single matrix of nucleation sites includes at least one element from a periodic chart grouping that includes molybdenum and tungsten, and at least one element from a periodic chart grouping that includes arsenic and antimony.

16. A semiconductor structure for providing a low resistivity conductive layer, the semiconductor structure comprising:
    a source/drain region, the source/drain region supported by a substrate; and
    a titanium silicide layer, the titanium silicide layer coupled to the source/drain region by a single matrix of nucleation sites, wherein the titanium silicide layer includes a low resistivity titanium silicide with a reduced grain size, wherein the reduced grain size of the low resistivity titanium silicide layer is less than about 0.25 microns.

17. The semiconductor structure of claim 16, wherein the low resistivity titanium silicide has C54 TiSi$_2$ lattice structure.

18. The semiconductor structure of claim 16, wherein the single matrix of nucleation sites includes at least one element from a periodic chart grouping that includes molybdenum and tungsten.

19. The semiconductor structure of claim 16, wherein the single matrix of nucleation sites includes at least one element from a periodic chart grouping that includes molybdenum and tungsten, and at least one element from a periodic chart grouping that includes arsenic and antimony.

20. The semiconductor layer of claim 18, wherein at least one element of the single matrix of nucleation sites has a dose of approximately $5\times10^{11}$ atoms/cm$^2$ to approximately $1\times10^{14}$ atoms/cm$^2$.

21. A semiconductor layer for providing a low resistivity conductive layer, the semiconductive layer comprising a low resistivity titanium silicide with a reduced grain size, the low resistivity titanium silicide having a single matrix of nucleation sites, wherein the reduced grain size of the low resistivity titanium silicide is less than about 0.25 microns.

22. The semiconductor layer of claim 21, wherein the low resistivity titanium silicide has a C54 TiSi$_2$ lattice structure.

23. The semiconductor layer of claim 21, wherein the single matrix of nucleation sites includes at least one element from a periodic chart grouping that includes molybdenum.

24. The semiconductor layer of claim 21, wherein the single matrix of nucleation sites includes at least one element from a periodic chart grouping that includes molybdenum and tungsten, and at least one element from a periodic chart grouping that includes arsenic and antimony.

25. A semiconductor layer for providing a low resistivity conductive layer, the semiconductive layer comprising titanium silicide, the titanium silicide having a C54 TiSi$_2$ lattice structure, the titanium silicide having a single matrix of nucleation sites,
    wherein the titanium silicide has a grain size of less than about 0.25 microns.

26. The semiconductor layer of claim 25, wherein the single matrix of nucleation sites includes at least one element from a periodic chart grouping that includes molybdenum and tungsten.

27. The semiconductor layer of claim 26, wherein at least one element of the single matrix of nucleation sites has a dose of approximately $5\times10^{11}$ atoms/cm$^2$ to approximately $1\times10^{14}$ atoms/cm$^2$.

28. The semiconductor layer of claim 25, wherein the single matrix of nucleation sites includes at least one element from a periodic chart grouping that includes molybdenum and tungsten, and at least one element from a periodic chart grouping that includes arsenic and antimony.

29. A integrated circuit having sub-0.25 micron features and a low resistivity conductive layer, the integrated circuit comprising titanium silicide, the titanium silicide having a C54 TiSi$_2$ lattice structure, the titanium silicide having a single matrix of nucleation sites,
    wherein the titanium silicide has a grain size of less than about 0.25 microns.

30. A integrated circuit having sub-0.25 micron features and a low resistivity conductive layer, the integrated circuit comprising a low resistivity titanium silicide with a reduced grain size, the low resistivity titanium silicide having a single matrix of nucleation sites, wherein the reduced grain size of the low resistivity titanium silicide is less than about 0.25 microns.

31. An ultra-large scale integrated (ULSI) circuit having low resistivity conductive lines, the ULSI circuit comprising:
- a substrate;
- a gate oxide layer, the gate oxide coupled to the substrate;
- a titanium silicide layer, the titanium silicide layer having a C54 $TiSi_2$ lattice structure, the titanium silicide layer including a low resistivity titanium silicide with a reduced grain size, wherein the reduced grain size of the low resistivity titanium silicide is less than about 0.25 microns; and
- a semiconductor layer, the semiconductor layer being between the gate oxide layer and the titanium silicide layer, wherein the titanium silicide layer is coupled to the semiconductor layer by a single matrix of nucleation sites.

32. An ultra-large scale integrated (ULSI) circuit having low resistivity conductive lines, the ULSI circuit comprising:
- a substrate;
- a gate oxide layer, the gate oxide layer coupled to the substrate;
- a silicon based material layer, the silicon based material layer coupled to the gate oxide layer; and
- a titanium silicide layer, the titanium silicide layer including a low resistivity titanium silicide with a reduced grain size, the titanium silicide layer coupled to the silicon based material layer by a single matrix of nucleation sites,
- wherein the reduced grain size of the low resistivity titanium silicide is less than about 0.25 microns.

* * * * *

UNITED STATES PATENT AND TRADEMARK OFFICE
CERTIFICATE OF CORRECTION

PATENT NO.    : 6,445,045 B2
DATED         : September 3, 2002
INVENTOR(S)   : Yongjun Hu It is certified that error appears in the above-identified patent and that said Letters Patent is hereby corrected as shown below:

<u>Title page,</u>
Item [56], U.S. PATENT DOCUMENTS, delete "et al." after "Kapoor".

<u>Column 8,</u>
Line 28, insert -- and tungsten -- after "molybdenum".

Signed and Sealed this

Second Day of September, 2003

JAMES E. ROGAN
*Director of the United States Patent and Trademark Office*